(12) United States Patent
Zhou et al.

(10) Patent No.: US 7,253,630 B1
(45) Date of Patent: Aug. 7, 2007

(54) ELECTRO-OPTICAL VOLTAGE SENSOR CIRCUIT MONITORING LEAKAGE OR LOSS OF VACUUM OF A VACUUM INTERRUPTER AND VACUUM CIRCUIT INTERRUPTER INCLUDING THE SAME

(75) Inventors: Xin Zhou, Franklin Park, PA (US); James J. Benke, Pittsburgh, PA (US); Daniel E. Palmieri, Aliquippa, PA (US)

(73) Assignee: Gaton Corporation, Cleveland, OH (US)

( * ) Notice: Subject to any disclaimer, the term of this patent is extended or adjusted under 35 U.S.C. 154(b) by 0 days.

(21) Appl. No.: 11/470,001

(22) Filed: Sep. 5, 2006

(51) Int. Cl.
*G01R 31/02* (2006.01)
(52) U.S. Cl. ...................... 324/424; 218/122
(58) Field of Classification Search ........... 324/424, 324/460; 218/122
See application file for complete search history.

(56) References Cited

U.S. PATENT DOCUMENTS

| | | | |
|---|---|---|---|
| 4,103,291 A | * | 7/1978 | Howe et al. ............ 340/522 |
| 4,403,124 A | | 9/1983 | Perkins et al. |
| 4,471,309 A | | 9/1984 | Lange et al. |
| 4,491,704 A | | 1/1985 | Milianowicz et al. |
| 4,546,319 A | * | 10/1985 | Pfaff et al. ............. 324/460 |
| 4,547,769 A | * | 10/1985 | Tanigaki et al. ......... 340/626 |
| 4,937,698 A | * | 6/1990 | Toya et al. ............. 361/86 |
| 6,373,358 B1 | | 4/2002 | Davies et al. |

OTHER PUBLICATIONS

Optisense Network, Inc., "Electro Optic High Voltage Sensor", 2006, 2 pp.
Optisense Network, Inc., "Electro Optic Voltage Sensor", 2004, 2 pp.
Optisense Network, Inc., "Electro-Optic High Voltage Sensor for Outdoor Applications", 2005, 2 pp.
Optisense Network, Inc., "Electro-Optic High Voltage Sensor for Indoor Applications", 2005, 2 pp.
Hortec B.V., "Instructions for use of integrated VDS", Nov. 15, 2000, 19 pp.
Eaton Corporation, "Integrated Partial Discharge Sensors IPDS-15 and Reference Voltage Sensors RVS", Jan. 2003, 4 pp.

\* cited by examiner

*Primary Examiner*—Walter Benson
(74) *Attorney, Agent, or Firm*—Martin J. Moran

(57) ABSTRACT

A vacuum circuit breaker includes a line terminal, a load terminal and a vacuum interrupter having a vacuum envelope containing a fixed contact assembly and a moveable contact assembly moveable between closed and open circuit positions. The fixed contact assembly is electrically interconnected with the line terminal and the moveable contact assembly is electrically connected to the load terminal. An operating mechanism moves the moveable contact assembly between the closed and open circuit positions. An auxiliary contact indicates one of the open or closed circuit positions. An electro-optical voltage sensor determines a voltage difference between the line and load terminals, or the shield and one of the line and load terminals. A circuit determines no leakage or loss of vacuum of the vacuum envelope when the vacuum switch is intended to be in the open circuit position and when the voltage difference is greater than a predetermined amount.

14 Claims, 6 Drawing Sheets

ELECTRO-OPTICAL VOLTAGE SENSOR CIRCUIT MONITORING LEAKAGE OR LOSS OF VACUUM OF A VACUUM INTERRUPTER AND VACUUM CIRCUIT INTERRUPTER INCLUDING THE SAME

CROSS REFERENCE TO RELATED APPLICATION

This application is related to commonly assigned, copending application Ser. No. 11/058,610, filed Feb. 15, 2005, entitled "Vacuum Circuit Interrupter Including Circuit Monitoring Leakage Or Loss Of Vacuum And Method Of Monitoring A Vacuum Interrupter For Leakage Or Loss Of Vacuum".

BACKGROUND OF THE INVENTION

1. Field of the Invention

This invention pertains generally to circuit interrupters and, more particularly, to such circuit interrupters employing one or more poles each of which includes a vacuum interrupter. The invention also pertains to apparatus for monitoring a vacuum interrupter for leakage or loss of vacuum of the vacuum envelope.

2. Background Information

Circuit interrupters provide protection for electrical systems from electrical fault conditions such as, for example, current overloads, short circuits and abnormal level voltage conditions. Typically, circuit interrupters include a spring powered operating mechanism which opens electrical contacts to interrupt the current through the conductors of an electrical system in response to abnormal conditions, although a wide range of driving mechanisms may be employed.

Circuit interrupters, such as, for example, power circuit breakers for systems operating above about 1,000 volts typically utilize vacuum interrupters (VIs) as the switching devices. Vacuum circuit interrupters include separable main contacts disposed within an insulating housing. Generally, one of the contacts is fixed relative to both the housing and to an external electrical conductor which is interconnected with the power circuit associated with the circuit interrupter. The other contact is moveable. In the case of a vacuum circuit interrupter, the moveable contact assembly usually comprises a stem of circular cross-section having the contact at one end enclosed within a vacuum chamber and a driving mechanism at the other end which is external to the vacuum chamber. An operating rod assembly comprising a push rod, which is fastened to the end of the stem opposite the moveable contact, and a driving mechanism provide the motive force to move the moveable contact into or out of engagement with the fixed contact.

VIs are typically used, for instance, to reliably interrupt medium voltage alternating current (AC) currents and, also, high voltage AC currents of several thousands of amperes or more. Typically, one VI is provided for each phase of a multi-phase circuit and the VIs for the several phases are actuated simultaneously by a common operating mechanism, or separately by separate operating mechanisms (and separate auxiliary switches).

A leaking VI is extremely rare. However, if a leak does occur, then the VI may not be able to interrupt a corresponding current flow and/or it may not be able to withstand the required voltage when its separable contacts are open. Loss of vacuum due to leakage of a VI is one of the major failure modes of vacuum circuit interrupters. Currently, there is no known cost effective method or technology to monitor the vacuum status inside the VI.

A known technology to measure or detect the vacuum integrity of a VI is to use two potential transformers to measure the voltage change across the VI. As the pressure inside the VI gets higher, the breakdown voltage decreases based on the "Paschen Curve". The change of the breakdown voltage while the contacts are open and a sufficiently high voltage applied across the contacts provides an indication of the vacuum integrity of the VI. However, this can hardly be implemented into a circuit breaker or a circuit breaker enclosure due to the relatively large size of the potential transformers.

Paschen's Law essentially states that the breakdown characteristics of a gap are a function (generally not linear) of the product of the gas pressure and the gap length, usually written as V=f(pd), wherein p is the pressure and d is the gap distance. FIG. 1 shows the "Paschen Curve" for air, in which two flat parallel copper electrodes are separated by 0.1 inch, for pressures between about $3 \times 10^{-2}$ torr and 760 torr. As the pressure is reduced below a few torr, the curve of breakdown voltage versus pressure reaches a minimum, and then, as pressure is further reduced, rises steeply again.

There is a need, therefore, to detect a loss of vacuum or a leaking vacuum of a VI in a cost effective manner.

SUMMARY OF THE INVENTION

These needs and others are met by embodiments of the invention, which monitor a vacuum interrupter for leakage or loss of vacuum. By employing an electro-optical voltage sensor, a current leakage detector can be implemented into a vacuum circuit interrupter due to a significant size reduction. The electro-optical voltage sensor utilizes the impact of the electrical field on optical properties to measure voltage drop. This eliminates the need for two voltage sensors as are required by prior potential transformer technology. The electro-optical high voltage sensor can be, for example, embedded on one of the isolation stands close to the vacuum interrupter.

As one aspect of the invention, a vacuum circuit interrupter comprises: a first terminal; a second terminal; a vacuum switch comprising a vacuum envelope containing a fixed contact assembly and a moveable contact assembly moveable between a closed circuit position in electrical communication with the fixed contact assembly and an open circuit position spaced apart from the fixed contact assembly, the fixed contact assembly being electrically interconnected with the first terminal, the vacuum envelope including a shield; means for electrically connecting the moveable contact assembly to the second terminal; an operating mechanism structured to move the moveable contact assembly between the closed circuit position and the open circuit position, the operating mechanism indicating whether the fixed contact assembly and the moveable contact assembly are intended to be in the open circuit position or the closed circuit position; an electro-optical voltage sensor structured to determine a voltage difference between: (a) the first and second terminals; or (b) the shield and one of the first and second terminals; and a circuit structured to determine no leakage or loss of vacuum of the vacuum envelope when the vacuum switch is intended to be in the open circuit position and when the voltage difference from the electro-optical voltage sensor is greater than a predetermined amount.

The electro-optical voltage sensor may be structured to output an alternating current voltage signal representative of the voltage difference. The circuit may include an alternating current voltage comparator comprising a peak detector structured to capture the peak of the alternating current voltage signal, a reference voltage representative of the predetermined amount, and a comparator having an output. The output of the comparator may be structured to be active when the peak of the alternating current voltage signal is greater than the reference voltage.

The peak detector may be structured to maintain the peak of the alternating current voltage signal for a predetermined time.

The operating mechanism may include an output having a signal representative of the fixed contact assembly and the moveable contact assembly being intended to be in the open circuit position. The circuit may comprise an AND gate including a first input inputting the signal from the operating mechanism, a second input inputting the output of the comparator, and an output having a signal representative of the no leakage or loss of vacuum of the vacuum envelope.

The electro-optical voltage sensor may include an electro-optical sensor electrically connected between (a) the first and second terminals or (b) the shield and one of the first and second terminals, a fiber optic cable cooperating with the electro-optical sensor, and an electronic circuit cooperating with the fiber optic cable to output an alternating current voltage signal representative of the voltage difference.

As another aspect of the invention, a monitoring apparatus is for monitoring a vacuum switch including a vacuum envelope containing a fixed contact assembly and a moveable contact assembly moveable between a closed circuit position in electrical communication with the fixed contact assembly and an open circuit position spaced apart from the fixed contact assembly, the fixed contact assembly being structured to be electrically interconnected with a first terminal, the vacuum envelope including a shield, the moveable contact assembly being structured to be electrically connected to a second terminal. The apparatus comprises: an electro-optical voltage sensor structured to determine a voltage difference between: (a) the first and second terminals; or (b) the shield and one of the first and second terminals; and a circuit structured to determine no leakage or loss of vacuum of the vacuum envelope when the vacuum switch is intended to be in the open circuit position and when the voltage difference from the electro-optical voltage sensor is greater than a predetermined amount.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

The invention is disclosed in connection with a pole of a medium voltage vacuum circuit breaker, although the invention is applicable to a wide range of vacuum circuit interrupters including any number of poles.

Figure 1:
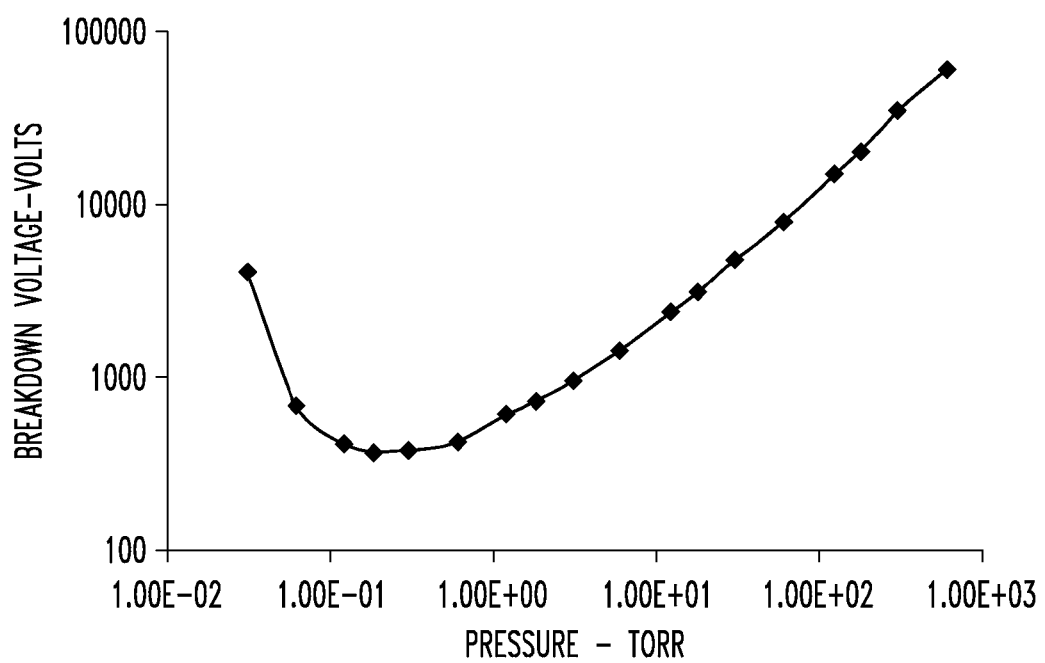
FIG. 1 is a plot of breakdown voltage versus air pressure for two flat parallel copper electrodes.
Figure 2:
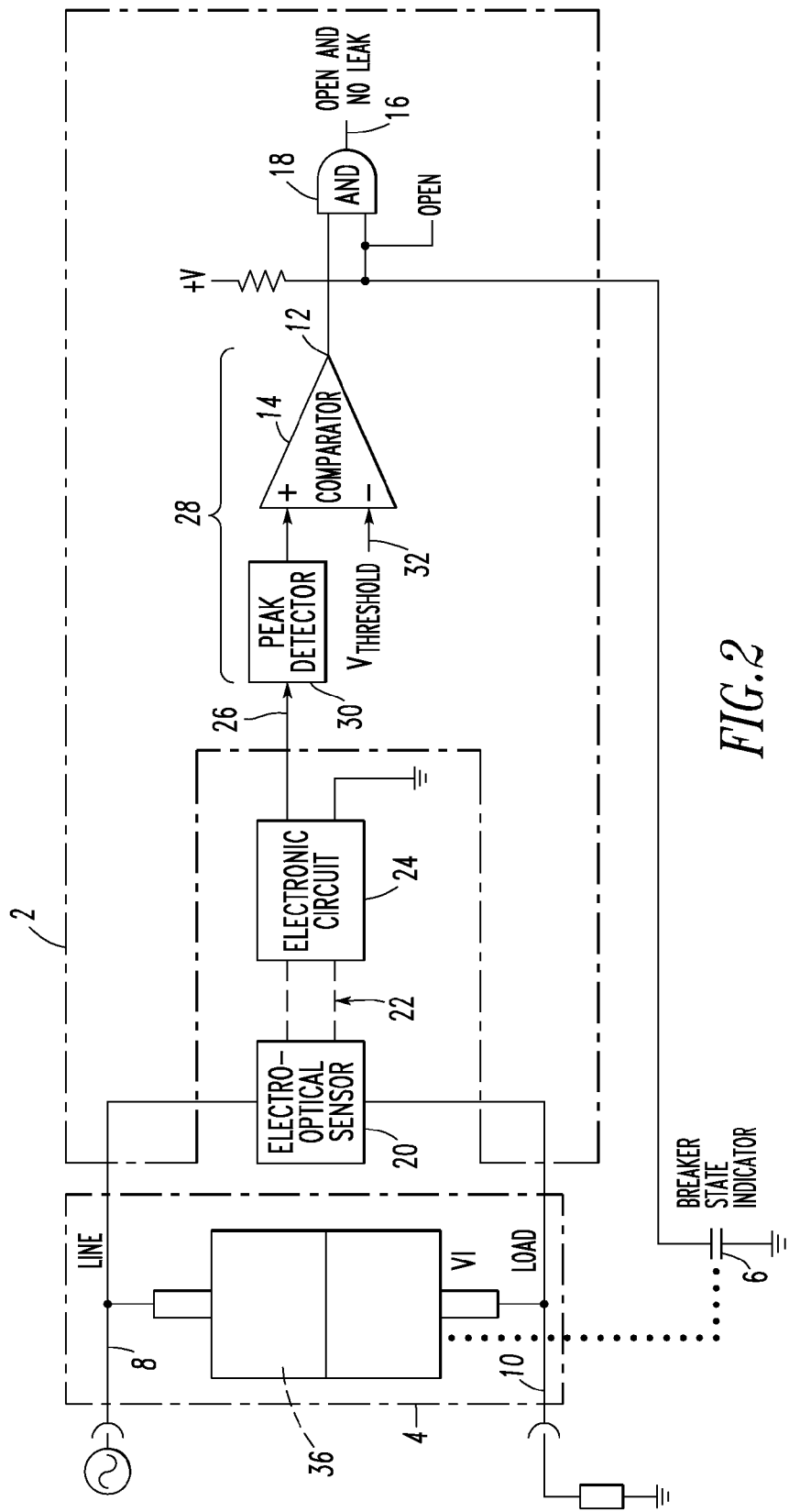
FIG. 2 is a block diagram in schematic form of a circuit for monitoring a medium voltage vacuum interrupter (VI) for leakage or loss of vacuum in accordance with an embodiment of the invention.

Referring to FIG. 2, a circuit 2 monitors a medium voltage vacuum interrupter (VI) 4 for leakage or loss of vacuum. With the VI 4 open, an associated breaker state indicator, such as auxiliary contact 6, is open. When the line side voltage 8 is significantly greater than the load side voltage 10, the output 12 of a comparator 14 is high. As a result, the OPEN AND NO LEAK signal 16 output by AND gate 18 is high.

The circuit 2 is advantageously employed to monitor the open state of the VI 4 for significant leakage or loss of vacuum. With the VI 4 open, the auxiliary contact 6 is open. Under normal conditions, with no significant leakage or loss of vacuum, the line side voltage 8 (e.g., voltage=V) is significantly greater than the load side voltage 10 (e.g., voltage=0 or ≈0 because of capacitance in the insulation system of the circuit breaker (not shown) or other elements of the corresponding power circuit). As a result, the output 12 of the comparator 14 is high.

On the other hand, under abnormal conditions of significant leakage or loss of vacuum, and with the VI 4 being open, the line side voltage 8 is not significantly greater than the load side voltage 10. As a result, the output 12 of the comparator 14 is low. Therefore, the OPEN AND NO LEAK signal 16 output by the AND gate 18 is low. The OPEN AND NO LEAK signal 16 output by the AND gate 18 is also low when the VI 4 is closed and, thus, the auxiliary contact 6 is closed.

The circuit 2 cooperates with an electro-optical sensor 20, a fiber optic cable 22 and an electronic circuit 24 structured to output an alternating current voltage signal 26 that represents the difference between the line side voltage 8 and the load side voltage 10. An alternating current voltage comparator 28 includes a peak detector 30 and the comparator 14. The comparator output 12 is high when the peak of the alternating current voltage signal 26, as captured by the peak detector 30, is greater than the suitable predetermined threshold voltage ($V_{THRESHOLD}$) 32. The peak detector 30 may maintain the corresponding peak voltage for a suitable time period (e.g., without limitation, about one line cycle; several line cycles; substantially continuously; any suitable time period). If the VI 4 is open (as shown by the open state of the auxiliary contact 6), then both inputs of the AND gate 18 are true and the OPEN AND NO LEAK signal 16 output by the AND gate 18 is high.

Figure 6:
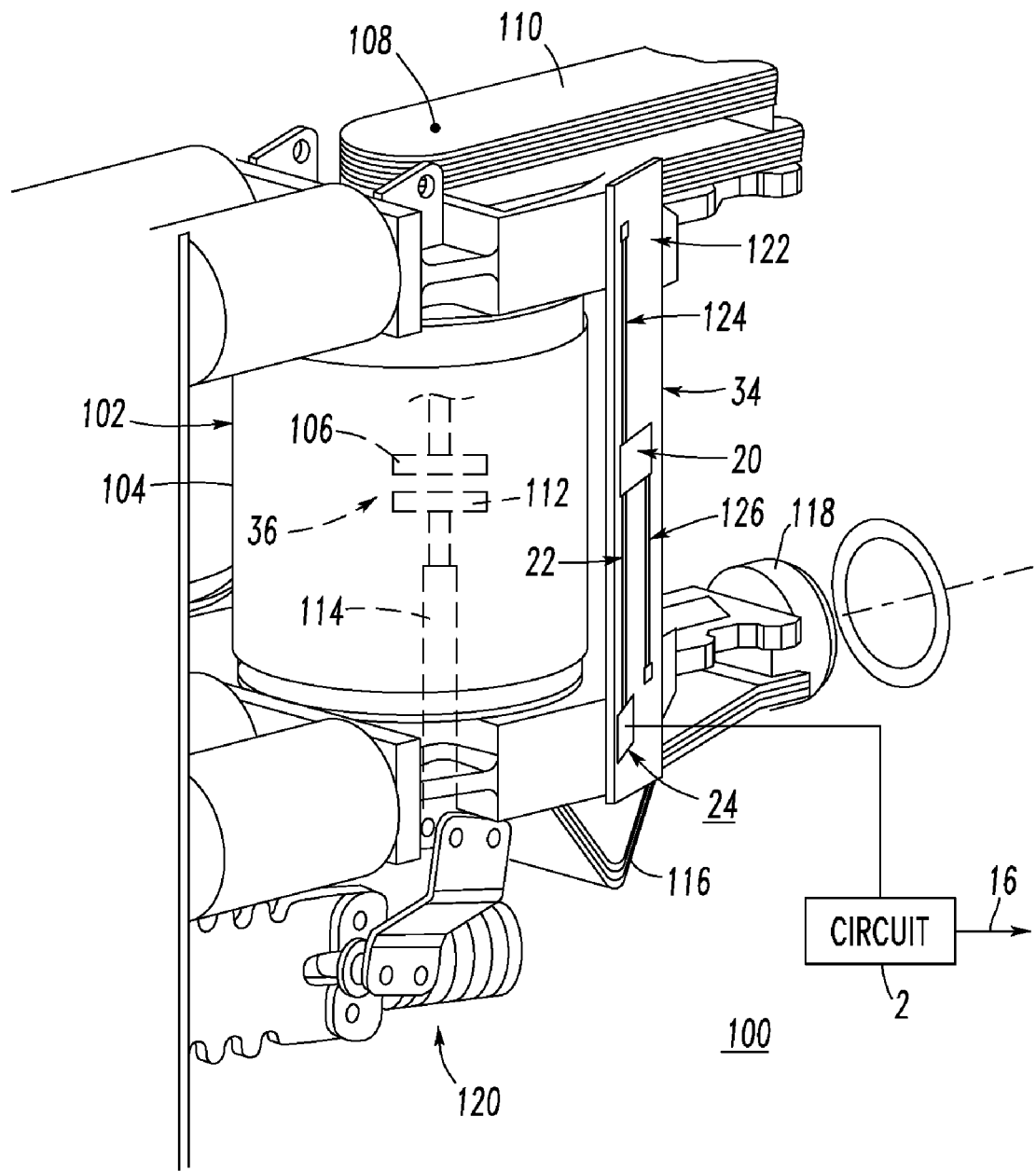
FIG. 6 is a simplified isometric view of a portion of a medium voltage vacuum circuit breaker including the circuit of FIG. 2 in accordance with another embodiment of the invention.

For example, the voltage sensor 20, as shown, is an electro-optical sensor structured to sense a medium voltage from about 1 kV up to about 40 kV. This relatively small and light electro-optical voltage sensor 20, which may advantageously be located on the top of or within an example circuit breaker isolation support 34 (as shown in FIG. 6), enables medium voltage measurement in a relatively compact package. The electro-optical voltage sensor 20 and electronic circuit 24 galvanically isolate the signal 26 to the peak detector 30 from the corresponding medium voltage being measured. An example of the electro-optical medium voltage sensor 20 is an OptiSense 15 kV Class Voltage Sensor for Embedded Applications marketed by OptiSense Network, Inc. of Bridgeport, Tex.

The circuit 2 may advantageously be employed to determine significant leakage or loss of vacuum of the VI 4. The circuit 2 employs the auxiliary contact 6 to determine whether the separable contacts 36 (e.g., as shown in FIG. 6 with VI 102) of the VI 4 are intended to be open or closed. The circuit 2 determines that there is significant leakage or the loss of vacuum of the VI 4 when the separable contacts 36 are intended to be open and when the voltage difference between the line and load sides is not within a predetermined amount (e.g., without limitation, about 70% to about 100%) of the line side voltage. Based upon that predetermined amount and the nominal line side voltage 8, the threshold voltage 32 is readily predetermined by one of ordinary skill in the art.

Figure 3:
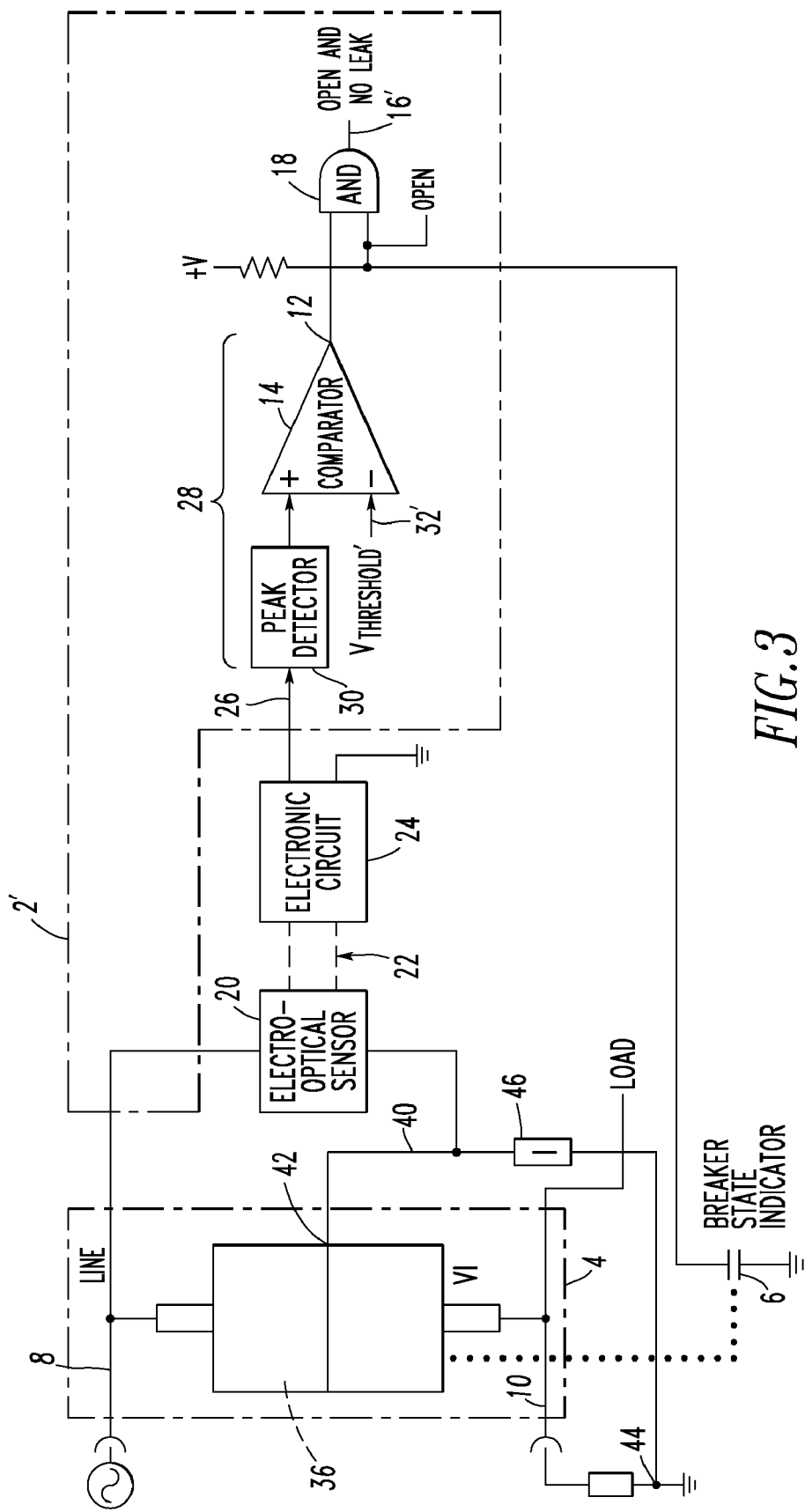
FIG. 3 is a block diagram in schematic form of a circuit for monitoring a medium voltage VI for leakage or loss of vacuum in accordance with another embodiment of the invention.

FIG. 3 shows another circuit 2' for monitoring the medium voltage VI 4 for leakage or loss of vacuum by sensing the voltage difference between the line side voltage 8 and a shield voltage 40. Otherwise, the circuit 2' is somewhat similar to the circuit 2 of FIG. 2. The circuit 2' may advantageously be employed to determine significant leakage or loss of vacuum of the VI 4 for the intended open state thereof as determined by auxiliary contact 6, which is open whenever the VI 4 is in the open state or closed whenever the VI 4 is in the closed state.

The circuit 2' detects significant leakage or loss of vacuum of the VI 4 (e.g., a "leaker") by comparing the shield voltage 40 on shield 42 with the voltage at one end (e.g., the line side voltage 8) of the VI 4. Preferably, a suitably high impedance connection is provided from the shield 42 to ground 44 by impedance (I) 46. Alternatively, any suitable external impedance (e.g., resistor; capacitor; resistor and capacitor), may be employed in order to conduct a relatively small current.

If the vacuum of the VI 4 begins to fail, then that reduced vacuum will begin to conduct and current will begin to flow from the source (e.g., the line side voltage 8) to the shield 42 and through the impedance 46. This pulls the shield voltage 40 closer to the line side voltage 8. A relatively poorer vacuum results in relatively greater shield current and, thus, a relatively higher shield voltage 40.

If the VI 4 is closed, then the line side voltage 8 normally equals the load side voltage 10. In this example of FIG. 3, the line side voltage 8 is employed.

In the event that the vacuum is "poor" (e.g., vacuum envelope pressure>$10^{-2}$ torr) and the VI 4 is a "leaker," then the external impedance 46 will conduct a relatively small current. Hence, if the line voltage 8 (e.g., line voltage=V) is about the same as the shield voltage 40 (e.g., shield voltage V), then the VI 4 is a "leaker".

In the event that the vacuum is "marginal" (e.g., $10^{-3}$ torr<vacuum envelope pressure<$10^{-2}$ torr), then the external impedance 46 will conduct relatively less current, in order that the shield voltage 40 falls into a questionable range (e.g., 0+Δ<shield voltage<V−Δ, wherein Δ is a suitable predetermined voltage), then the VI 4 is "marginal".

In the event that the vacuum is "good" (e.g., vacuum envelope pressure<$10^{-3}$ torr), then the external impedance 46 will conduct relatively minimal current, in order that the shield voltage 40 is sufficiently close to zero (e.g., shield voltage<Δ, wherein Δ is a predetermined voltage; shield voltage<<V), then the VI 4 is "good".

Functionally, if the VI 4 is closed, then the line side voltage 8 is normally insignificantly greater than the load side voltage 10 and the shield voltage 40 is below a threshold value (e.g., Δ; a percentage of the line side voltage 8; a percentage of the load side voltage 10). Otherwise, the presence of a suitably high shield voltage 40 on the shield 42, while either the line side voltage 8 or the load side voltage 10 is energized, indicates that the VI 4 may have at least a partial loss of vacuum.

On the other hand, if the VI 4 is open, then the line side voltage 8 is normally significantly greater than the load side voltage 10 and the shield voltage 40 is normally below a threshold value (e.g., Δ; a percentage of the line side voltage 8), and the OPEN AND NO LEAK signal 16' is active. Otherwise, the presence of a suitably high shield voltage 40 on the shield 42, while the line side voltage 8 is energized, indicates that the VI 4 may have at least a partial loss of vacuum.

The circuit 2' advantageously monitors the medium voltage VI 4 for leakage or loss of vacuum. The auxiliary contact 6 determines whether the VI 4 is intended to be open or closed. The circuit 2' determines that there is no significant leakage or the loss of vacuum of the VI 4 when the separable contacts 36 (FIG. 6) are intended to be open and when the difference between the shield voltage 40 and the line side voltage 8 is greater than a predetermined amount (e.g., without limitation, the voltage difference is greater than 70% of the line side voltage 8. Based upon that predetermined amount and the nominal line side voltage 8, the threshold voltage 32' is readily predetermined.

Figure 4:
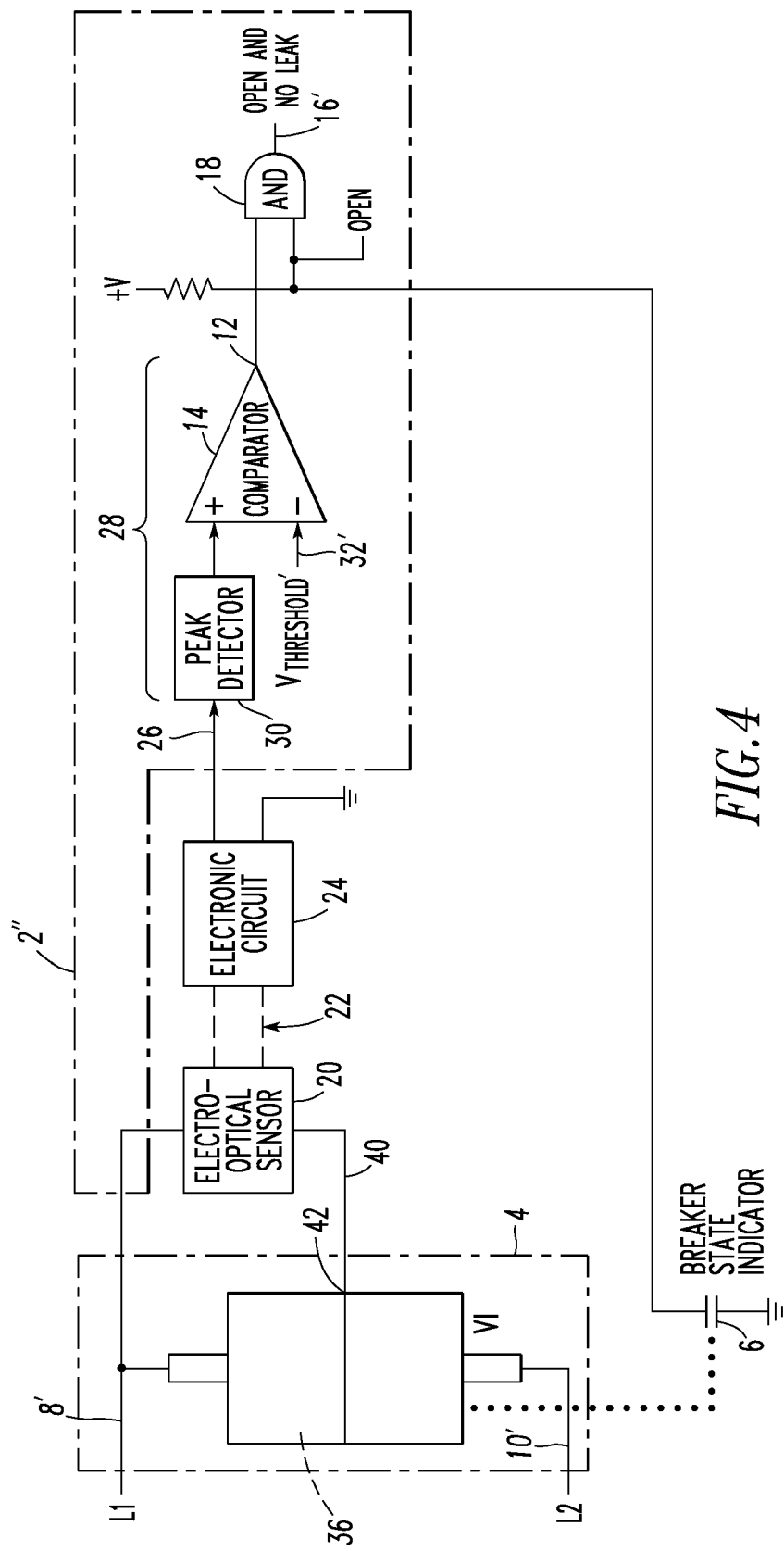
FIG. 4 is a block diagram in schematic form of a circuit for monitoring a medium voltage VI for leakage or loss of vacuum using a first or line side voltage and a shield voltage in accordance with another embodiment of the invention.

FIG. 4 shows a circuit 2'' for monitoring the VI 4 for leakage or loss of vacuum when the VI is open. Here, depending upon the application of the corresponding circuit breaker (not shown), the first voltage L1 8' may be either a line side voltage or a load side voltage and the second voltage L2 10' may be either a load side voltage or a line side voltage, respectively. In this example, however, the first voltage L1 8' is a line side voltage. Here, the circuit 2'' would not monitor the VI 4 for leakage or loss of vacuum when the VI is open if the first voltage L1 8' was a load side voltage, since it would not be energized when the VI 4 was open. Otherwise, the circuit 2'' is the same as the circuit 2' of FIG. 3.

Figure 5:
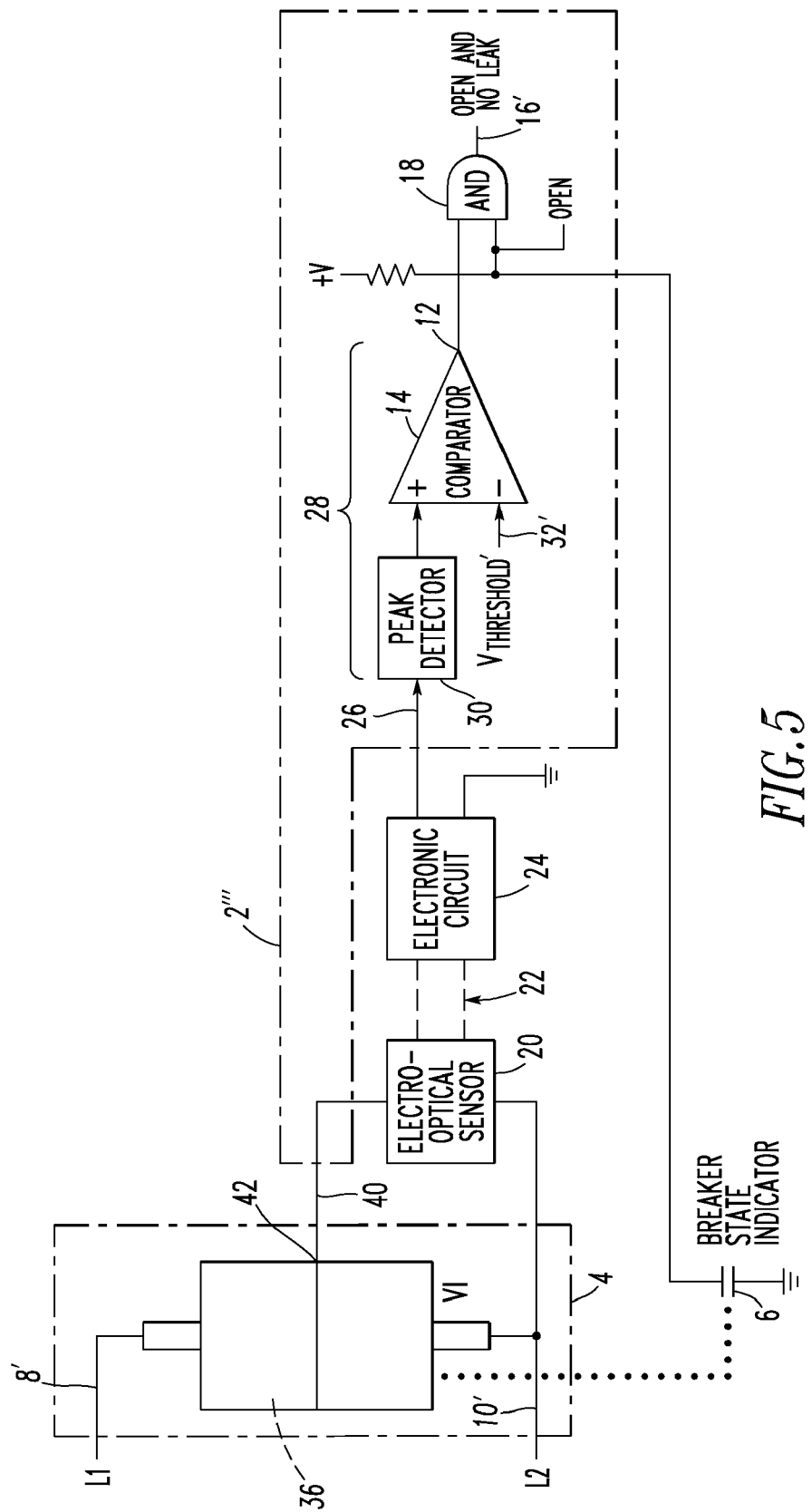
FIG. 5 is a block diagram in schematic form of a circuit for monitoring a medium voltage VI for leakage or loss of vacuum using a second or line side voltage and a shield voltage in accordance with another embodiment of the invention.

FIG. 5 shows a circuit 2''' for monitoring the VI 4 for leakage or loss of vacuum when the VI is open. Again, depending upon the application of the corresponding circuit breaker (not shown), the first voltage L1 8' may be either a line side voltage or a load side voltage and the second voltage L2 10' may be either a load side voltage or a line side voltage, respectively. In this example, however, the second voltage L2 10' is a line side voltage. Here, the circuit 2''' would not monitor the VI 4 for leakage or loss of vacuum when the VI is open if the second voltage L2 10' was a load side voltage, since it would not be energized when the VI 4 was open. Otherwise, the circuit 2''' is the same as the circuit 2'' of FIG. 4.

FIG. 6 shows a three-pole (only one pole is shown in FIG. 6) power vacuum circuit breaker 100 including the circuit 2 of FIG. 2. An example of a power vacuum circuit breaker, excluding the circuit 2, is disclosed in U.S. Pat. No. 6,373,358, which is incorporated by reference herein. The three poles, one for each phase of a three-phase power distribution system (not shown), each carry a suitable vacuum switch, such as VI 102 of FIG. 6.

The VI 102 has the separable contacts 36 housed in a vacuum envelope, such as bottle 104. The upper or fixed contact 106 of the separable contacts 36 is electrically connected at first terminal 108 to a line conductor 110, which extends rearward for connection to a utility bus (not shown). The lower, or moveable, contact 112 of the separable contacts 36 is electrically connected through moveable stem 114 and a flexible shunt 116 to a second terminal 118 for a load conductor (not shown), which likewise extends rearward for connection to a load bus (not shown). Although the flexible shunt 116 is shown, any suitable mechanism or circuit for electrically connecting the moveable contact 112 to the second terminal 118 may be employed. The moveable contact 112 is mechanically connected through an operating mechanism 120 and is moveable between a closed circuit position (not shown) in electrical communication with the fixed contact 106 and an open circuit position (as shown in FIG. 6) spaced apart from the fixed contact. The operating mechanism 120 is structured to move the moveable contact 112 between the closed circuit position and the open circuit position. The operating mechanism 120 cooperates with the breaker state indicator 6 of FIG. 2, which indicates whether the fixed contact 106 and moveable contact 112 are intended to be in the open circuit position or the closed circuit position.

An insulative isolation stand 122 carries a first embedded conductor (e.g., wire 124) that is electrically connected to the line side at the first terminal 108 or line conductor 110, and also carries a second embedded conductor (e.g., wire 126) that is electrically connected to the load side at the flexible shunt 116 or second terminal 118. The electro-optical sensor 20, the fiber optic cable 22 and the electronic circuit 24 of FIG. 2 are preferably embedded or molded in the isolation stand 122.

EXAMPLE 1

In the circuit breaker 100, the source of the breaker state indicator 6 (FIG. 2) is a conventional output from an auxiliary circuit contact (e.g., without limitation, contact open or high for the circuit breaker being open; contact closed or low for the circuit breaker being closed).

EXAMPLE 2

Existing circuit breakers have several different ways of indicating the circuit breaker state of closed or open. One example is an electro-mechanical indicator called the auxiliary switch. The auxiliary switch consists of "normally open" and/or "normally closed" contacts mounted in the circuit breaker that open or close whenever the breaker is opened or closed. A mechanical linkage, which is connected to the pole shaft (not shown) of the circuit breaker 100, interacts with a knife blade type switch (not shown) to change states. Therefore, wires and/or other devices can be connected to this device in order to indicate mechanically and/or electronically the state of the circuit breaker 100.

EXAMPLE 3

During fault current interruption, the resulting arc can actually "hit" the shield 42 (FIG. 3), which would give the same result as a "leaker" for several milliseconds. Therefore, the circuits 2, 2',2",2''' are preferably turned "off" for a suitable period (e.g., without limitation, several milliseconds; several minutes) (depending upon the circuit) during switching operations.

EXAMPLE 4

As an alternative to Example 3, the outputs of the circuits 2, 2',2",2''' are ignored during the interruption process.

EXAMPLE 5

As an alternative to Examples 3 and 4, the AC comparator 28 (FIG. 3) is suitably filtered to respond in about 1 to about 100 milliseconds.

EXAMPLE 6

As an alternative to the external shield impedance 46 (FIG. 3), the local impedance of certain pole units (e.g., resulting from stray capacitance within the pole unit and/or the VI 4) might be sufficient such that the external shield impedance is not required.

EXAMPLE 7

The circuits 2,2',2",2''' may be integrally mounted within a vacuum circuit breaker, such as 100 (FIG. 6), to sense the loss, or partial loss, of vacuum from inside the VI 4 (FIG. 2) or 102 (FIG. 6). Preferably, those circuits are suitably insulated to avoid voltage breakdown issues (BIL test requirement).

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A vacuum circuit interrupter comprising:
   a first terminal;
   a second terminal;
   a vacuum switch comprising a vacuum envelope containing a fixed contact assembly and a moveable contact assembly moveable between a closed circuit position in electrical communication with the fixed contact assembly and an open circuit position spaced apart from the fixed contact assembly, said fixed contact assembly being electrically interconnected with said first terminal, said vacuum envelope including a shield;
   means for electrically connecting said moveable contact assembly to said second terminal;
   an operating mechanism structured to move said moveable contact assembly between the closed circuit position and the open circuit position, said operating mechanism indicating whether the fixed contact assembly and the moveable contact assembly are intended to be in the open circuit position or the closed circuit position;
   an electro-optical voltage sensor structured to determine a voltage difference between: said first and second terminals; or said shield and one of said first and second terminals; and
   a circuit structured to determine no leakage or loss of vacuum of said vacuum envelope when said vacuum switch is intended to be in said open circuit position and when said voltage difference from said electro-optical voltage sensor is greater than a predetermined amount.

2. The vacuum circuit interrupter of claim 1 wherein said electro-optical voltage sensor is structured to output an alternating current voltage signal representative of said voltage difference; wherein said circuit includes an alternating current voltage comparator comprising a peak detector structured to capture the peak of said alternating current voltage signal, a reference voltage representative of said predetermined amount, and a comparator having an output; and wherein the output of said comparator is structured to be active when the peak of said alternating current voltage signal is greater than said reference voltage.

3. The vacuum circuit interrupter of claim 2 wherein said peak detector is structured to maintain the peak of said alternating current voltage signal for a predetermined time.

4. The vacuum circuit interrupter of claim 2 wherein said operating mechanism includes an output having a signal representative of the fixed contact assembly and the moveable contact assembly being intended to be in the open circuit position; and wherein said circuit comprises an AND gate including a first input inputting said signal from said operating mechanism, a second input inputting the output of said comparator, and an output having a signal representative of said no leakage or loss of vacuum of said vacuum envelope.

5. The vacuum circuit interrupter of claim 1 wherein said electro-optical voltage sensor includes an electro-optical sensor electrically connected between: said first and second terminals or said shield and one of said first and second terminals, a fiber optic cable cooperating with said electro-optical sensor, and an electronic circuit cooperating with said fiber optic cable to output an alternating current voltage signal representative of said voltage difference.

6. The vacuum circuit interrupter of claim 1 wherein said first terminal is a line terminal having a line voltage; wherein said second terminal is a load terminal; wherein said electro-optical voltage sensor is structured to determine said voltage difference between said line terminal and said load terminal; and wherein said predetermined amount is about 70% to about 100% of said line voltage.

7. The vacuum circuit interrupter of claim 1 wherein said electro-optical voltage sensor is structured to determine said voltage difference between said shield and one of said first and second terminals, said one of said first and second terminals having a line voltage; and wherein said predetermined amount is 70% of said line voltage.

8. The vacuum circuit interrupter of claim 1 wherein said first terminal has a line voltage; wherein said shield has a shield voltage; and wherein said electro-optical voltage sensor is structured to determine said voltage difference between the shield voltage of said shield and the line voltage of said first terminal.

9. The vacuum circuit interrupter of claim 1 wherein said second terminal has a line voltage; wherein said shield has a shield voltage; and wherein said electro-optical voltage sensor is structured to determine said voltage difference between the shield voltage of said shield and the line voltage of said second terminal.

10. The vacuum circuit interrupter of claim 1 wherein said electro-optical voltage sensor is structured to determine said voltage difference between said shield and one of said first and second terminals; and wherein said shield includes an output having an impedance electrically connected to ground.

11. The vacuum circuit interrupter of claim 1 wherein said vacuum circuit interrupter is a medium voltage vacuum circuit breaker.

12. The vacuum circuit interrupter of claim 1 wherein one of said first and second terminals is structured to receive a medium voltage.

13. The vacuum circuit interrupter of claim 1 wherein said operating mechanism includes an auxiliary contact structured to indicate whether the fixed contact assembly and the moveable contact assembly are intended to be in the open circuit position or the closed circuit position.

14. The vacuum circuit interrupter of claim 1 wherein said electro-optical voltage sensor is structured to be housed within said vacuum circuit interrupter.

* * * * *

UNITED STATES PATENT AND TRADEMARK OFFICE
CERTIFICATE OF CORRECTION

| | |
|---|---|
| PATENT NO. | : 7,253,630 B1 |
| APPLICATION NO. | : 11/470001 |
| DATED | : August 7, 2007 |
| INVENTOR(S) | : Xin Zhou et al. |

It is certified that error appears in the above-identified patent and that said Letters Patent is hereby corrected as shown below:

On the title page, Item (73), Column 1, Assignee, "Gaton" should read --Eaton--.

Signed and Sealed this
Twenty-second Day of October, 2013

Teresa Stanek Rea
*Deputy Director of the United States Patent and Trademark Office*